US009721625B2

(12) United States Patent
Amarilio et al.

(10) Patent No.: US 9,721,625 B2
(45) Date of Patent: Aug. 1, 2017

(54) TIME-CONSTRAINED DATA COPYING BETWEEN STORAGE MEDIA

(71) Applicant: QUALCOMM Incorporated, San Diego, CA (US)

(72) Inventors: Lior Amarilio, Yokneam (IL); Alexander Khazin, Nesher (IL)

(73) Assignee: QUALCOMM Incorporated, San Diego, CA (US)

( * ) Notice: Subject to any disclaimer, the term of this patent is extended or adjusted under 35 U.S.C. 154(b) by 218 days.

(21) Appl. No.: 14/722,291

(22) Filed: May 27, 2015

(65) Prior Publication Data

US 2015/0371690 A1    Dec. 24, 2015

Related U.S. Application Data

(60) Provisional application No. 62/013,723, filed on Jun. 18, 2014.

(51) Int. Cl.
*G06F 13/28* (2006.01)
*G11C 7/10* (2006.01)
(Continued)

(52) U.S. Cl.
CPC .......... *G11C 7/1075* (2013.01); *G06F 13/287* (2013.01); *G06F 13/364* (2013.01); (Continued)

(58) Field of Classification Search
CPC ... G11C 7/1075; G11C 7/1036; G06F 13/287; G06F 13/364; G06F 13/385; G06F 13/4022; G06F 13/4282; G06F 13/4295

See application file for complete search history.

(56) References Cited

U.S. PATENT DOCUMENTS 5,426,766 A * 6/1995 Ogata ..................... G06F 9/462
711/104
6,006,293 A * 12/1999 Thomas ................ G06F 9/3012
710/45

(Continued)

FOREIGN PATENT DOCUMENTS

EP       1115060 A2    7/2001

OTHER PUBLICATIONS

Second Written Opinion for PCT/US2015/032906, mailed Jun. 17, 2016, 6 pages.

(Continued)

*Primary Examiner* — Glenn A Auve
(74) *Attorney, Agent, or Firm* — Withrow & Terranova, PLLC

(57) ABSTRACT

Time-constrained data copying between storage media is disclosed. When an electronic device is engaged in real-time operations, multiple data blocks may need to be copied from one storage medium to another storage medium within certain time constraints. In this regard, a data port is operatively controlled by a plurality of registers of a first register bank. The plurality of registers is copied from the first register bank to a second register bank within a temporal limit and while the data port remains under control of the plurality of registers being copied. By copying the plurality of registers within the temporal limit, it is possible to prevent operational interruption in the data port and reduce bandwidth overhead associated with the register copying operation.

14 Claims, 9 Drawing Sheets

(51) Int. Cl.
  *G06F 13/40*  (2006.01)
  *G06F 13/42*  (2006.01)
  *G06F 13/364*  (2006.01)
  *G06F 13/38*  (2006.01)

(52) U.S. Cl.
  CPC ........ *G06F 13/385* (2013.01); *G06F 13/4022* (2013.01); *G06F 13/4282* (2013.01); *G06F 13/4295* (2013.01); *G11C 7/1036* (2013.01)

(56) References Cited

U.S. PATENT DOCUMENTS

| | | | |
|---|---|---|---|
| 6,122,679 | A | 9/2000 | Wunderlich |
| 7,526,526 | B2 | 4/2009 | Clemens et al. |
| 7,747,802 | B2 | 6/2010 | Deshpande et al. |
| 8,775,707 | B2 | 7/2014 | Poulsen |
| 2013/0275700 | A1 | 10/2013 | Wang et al. |
| 2013/0322462 | A1 | 12/2013 | Poulsen |

OTHER PUBLICATIONS

Notification Concerning Informal Communications with the Applicant for PCT/US2015/032906, mailed Nov. 3, 2016, 3 pages.
International Preliminary Report on Patentability for PCT/US2015/032906, mailed Nov. 8, 2016, 19 pages.
International Search Report and Written Opinion for International Patent Application No. PCT/US2015/032906, mailed Oct. 12, 2015, 10 pages.
MIPI Alliance, "Mipi alliance Specification for SoundWire," Version 1.0, Jan. 21, 2015, MIPI Alliance, Inc., 289 pages.

* cited by examiner

TIME-CONSTRAINED DATA COPYING BETWEEN STORAGE MEDIA

PRIORITY CLAIM

The present application claims priority to U.S. Patent Application Ser. No. 62/013,723, filed on Jun. 18, 2014, and entitled "DATA STREAMING BETWEEN A MASTER AND PLURAL SLAVE DEVICES," which is incorporated herein by reference in its entirety.

BACKGROUND

I. Field of the Disclosure

The technology of the disclosure relates generally to supporting data copying in mobile communication devices.

II. Background

Mobile communication devices have become increasingly common in current society. The prevalence of these mobile communication devices is driven in part by the many functions that are now enabled on such devices. Increased processing capabilities in such devices means that mobile communication devices have evolved from being purely communication tools into sophisticated mobile entertainment centers, thus enabling enhanced user experiences.

The mobile communication devices commonly include a microphone and speakers. The microphone and the speakers used in the mobile communication devices typically have analog interfaces which require a dedicated two-wire connection between each pair of devices. Since a mobile communication device is capable of supporting multiple audio devices, it may be desired to allow a microprocessor or other control device in the mobile communication device to communicate audio data to multiple audio devices over a common communication bus simultaneously.

In this regard, the MIPI® Alliance has developed a SoundWire$^{SM}$ (SoundWire) communication protocol for the mobile communication device (the "master") to distribute digital audio streams to one or more audio devices (the "slave(s)") via one or more SoundWire slave data ports. Sometimes, it may be necessary to reconfigure a slave data port to improve payload transport control and sampling operations while the slave data port is receiving the digital audio streams from the master. Hence, it is desirable to optimize the reconfiguration of the slave data port for improved user experience.

SUMMARY OF THE DISCLOSURE

Aspects disclosed in the detailed description include time-constrained data copying between storage media. When an electronic device is engaged in real-time operations, multiple data blocks may need to be copied from one storage medium to another storage medium within certain time constraints. For example, when a MIPI® Alliance SoundWire$^{SM}$ (SoundWire) data port is receiving a digital audio stream, operation control data may be copied from an active register bank to a passive register bank to reconfigure the SoundWire data port within one SoundWire frame duration. In this regard, a data port is operatively controlled by a plurality of registers of a first register bank. The plurality of registers is copied from the first register bank to a second register bank within a temporal limit and while the data port remains under control of the plurality of registers being copied. By copying the plurality of registers within the temporal limit, it is possible to prevent operational interruption in the data port and reduce bandwidth overhead associated with the register copying operation.

In this regard, in one aspect, a data port is provided. The data port comprises a first register bank comprising a plurality of first registers. The first register bank is configured to function as an active register bank to control a present operation of a data port. The data port also comprises a second register bank comprising a plurality of second registers. The second register bank is configured to function as a passive register bank to control a future operation of the data port. The data port also comprises a control logic coupled to the first register bank and the second register bank. The control logic is configured to copy the plurality of first registers of the first register bank to the plurality of second registers of the second register bank within a temporal limit and without interrupting the present operation of the data port.

In another aspect, a method for switching a data port from a present operation to a future operation is provided. The method comprises copying a plurality of first registers of a first register bank configured to control a present operation to a plurality of second registers of a second register bank configured to control a future operation in a data port. The method also comprises switching the data port from the present operation to the future operation by inverting the first register bank and the second register bank after copying the plurality of first registers of the first register bank to the plurality of second registers of the second register bank.

In another aspect, an electronic device is provided. The electronic device comprises a plurality of data ports. Each of the plurality of data ports comprises a respective first register bank comprising a plurality of first registers. The respective first register bank is configured to function as a respective active register bank to control a present operation of the data port. Each of the plurality of data ports also comprises a respective second register bank comprising a plurality of second registers. The respective second register bank is configured to function as a respective passive register bank to control a future operation of the data port. Each of the plurality of data ports also comprises a respective control logic coupled to the respective first register bank and the respective second register bank. The respective control logic is configured to copy the plurality of first registers of the respective first register bank to the plurality of second registers of the respective second register bank within a temporal limit and without interrupting the present operation of the data port. The electronic device also comprises a control system configured to control the plurality of data ports based on at least one control register.

In another aspect, a data interface is provided. The data interface comprises a plurality of data storage media. Each of the plurality of data storage media comprises a plurality of respective data blocks. The data interface also comprises a control logic. The control logic is configured to select a first data storage medium and a second data storage medium among the plurality of data storage media. The first data storage medium is an active data storage medium for controlling a present operation of a data interface. The second data storage medium is a passive data storage medium for controlling a future operation of the data interface. The control logic is also configured to copy the plurality of respective data blocks of the first data storage medium to the plurality of respective data blocks of the second data storage medium within a predetermined temporal limit. The control logic is also configured to switch the data interface to the future operation by inverting the first data storage medium and the second data storage medium.

DETAILED DESCRIPTION

Figure 1:
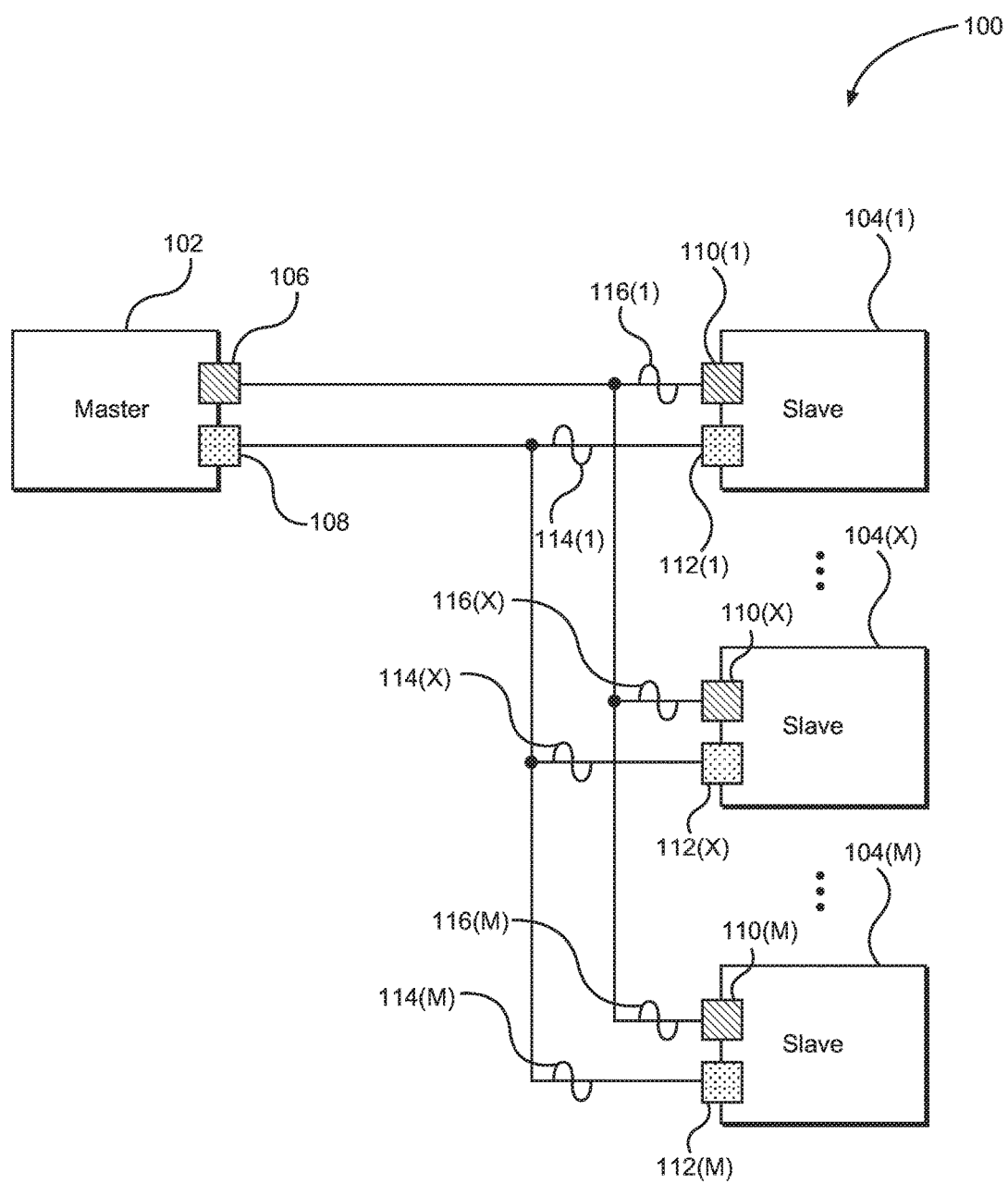
FIG. 1 is a schematic diagram of an exemplary conventional MIPI® Alliance SoundWire<sup>SM</sup> (SoundWire) system topology according to the MIPI® Alliance SoundWire specification version 1.0 published Jan. 21, 2015.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include time-constrained data copying between storage media. When an electronic device is engaged in real-time operations, multiple data blocks may need to be copied from one storage medium to another storage medium within certain time constraints. For example, when a MIPI® Alliance SoundWire<sup>SM</sup> (SoundWire) data port is receiving a digital audio stream, operation control data may be copied from an active register bank to a passive register bank to reconfigure the SoundWire data port within one SoundWire frame duration. In this regard, a data port is operatively controlled by a plurality of registers of a first register bank. The plurality of registers is copied from the first register bank to a second register bank within a temporal limit and while the data port remains under control of the plurality of registers being copied. By copying the plurality of registers within the temporal limit, it is possible to prevent operational interruption in the data port and reduce bandwidth overhead associated with the register copying operation.

Figure 2:
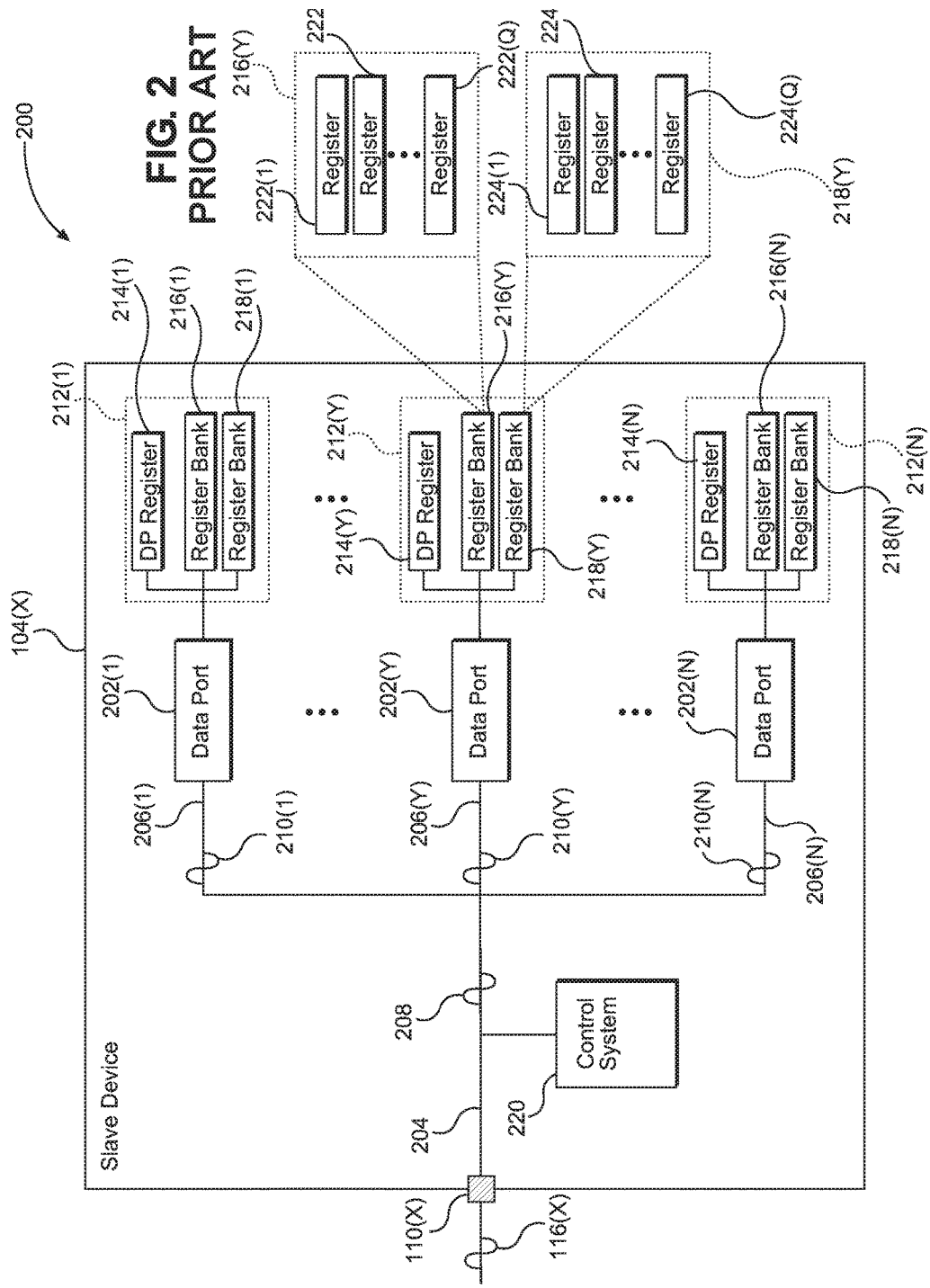
FIG. 2 is a schematic diagram of an exemplary conventional structure of a SoundWire slave device.
Figure 3:
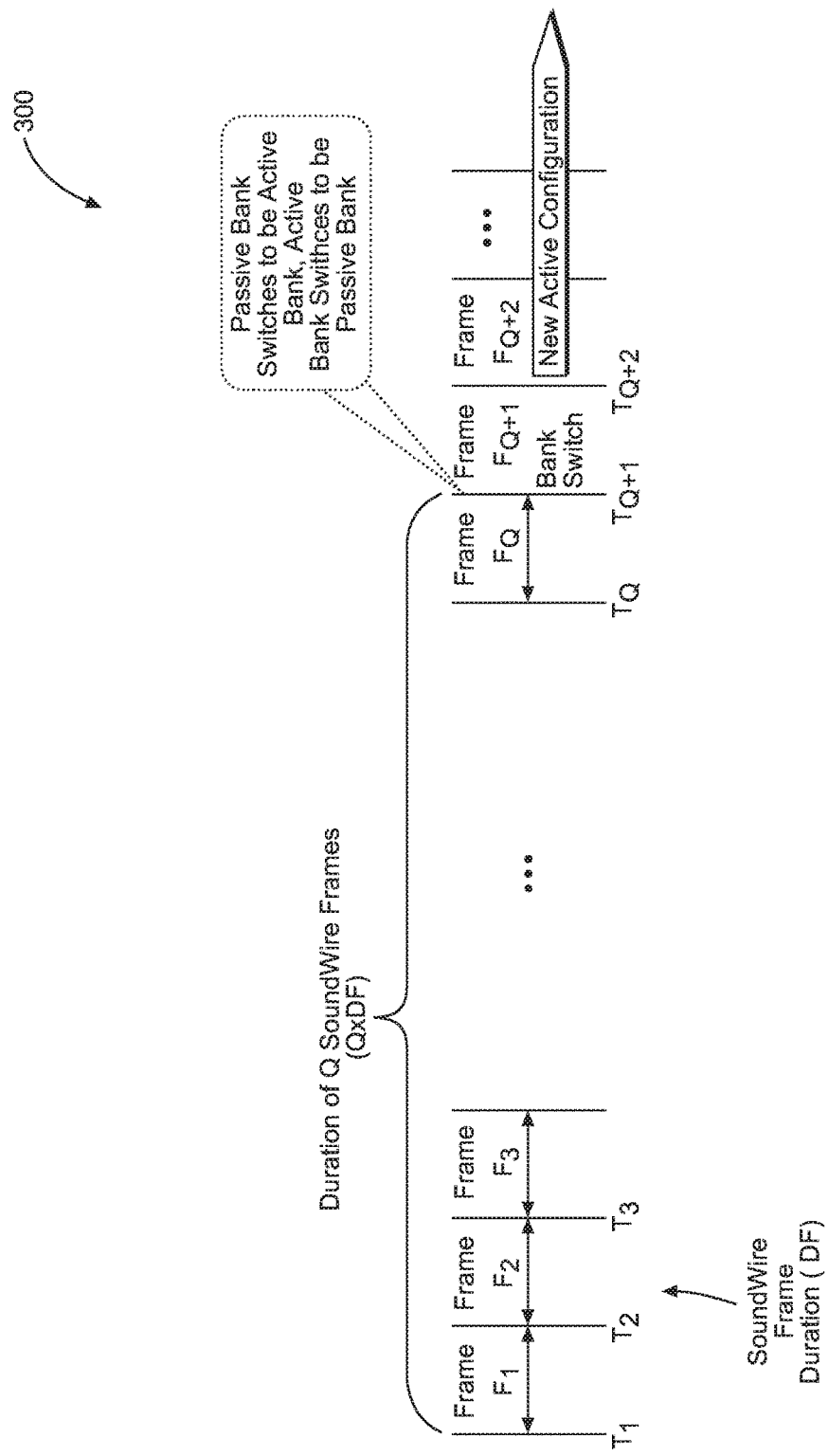
FIG. 3 is a plot of an exemplary timeline associated with switching a data port in the SoundWire slave device of FIG. 2 from a present operation to a future operation according to the SoundWire specification version 1.0.

Before discussing exemplary aspects of time-constrained data copying between storage media that include specific aspects of the present disclosure, a brief overview of a register bank copying operation, and related aspects, performed by a conventional SoundWire data port are first provided in FIGS. 1-3. The discussion of specific exemplary aspects of the time-constrained data copying between storage media starts below with reference to FIG. 4.

In this regard, FIG. 1 is a schematic diagram of an exemplary SoundWire system topology 100 according to the MIPI® Alliance SoundWire specification version 1.0 published Jan. 21, 2015, which is incorporated herein by reference. The SoundWire system topology 100 comprises a master device 102 and a plurality of slave devices 104(1)-104(M). According to the SoundWire specification version 1.0, the master device 102 may support up to eleven (11) slave devices. However, it may be possible for the master device 102 to support more than 11 slave devices in future SoundWire specifications. The master device 102 provides a data interface 106 and a clock interface 108. The plurality of slave devices 104(1)-104(M) comprises a plurality of respective slave data interfaces 110(1)-110(M) and a plurality of respective slave clock interfaces 112(1)-112(M). The master device 102 provides a plurality of respective clock signals 114(1)-114(M) from the clock interface 108 to the plurality of slave clock interfaces 112(1)-112(M). The master device 102 also communicates a plurality of respective data signals 116(1)-116(M) between the data interface 106 and the plurality of slave data interfaces 110(1)-110(M). Each of the plurality of data signals 116(1)-116(M) comprises control information and multiplexed payload streams associated with a respective slave device among the plurality of slave devices 104(1)-104(M).

To further illustrate inner structures of the plurality of slave devices 104(1)-104(M), slave device 104(X) is discussed next as a non-limiting example. In this regard, FIG. 2 is a schematic diagram of an exemplary conventional structure 200 of the slave device 104(X).

With reference to FIG. 2, data signal 116(X) received via slave data interface 110(X) is provided to a plurality of data ports 202(1)-202(N) via an internal SoundWire bus 204. The plurality of data ports 202(1)-202(N) correspond to a plurality of respective SoundWire channels 206(1)-206(N). In a non-limiting example, the plurality of SoundWire channels 206(1)-206(N) may be audio channels. The data signal 116(X) is de-multiplexed to generate a control signal 208 and a plurality of respective SoundWire payload streams 210(1)-210(N) that correspond to the plurality of data ports 202(1)-202(N). In this regard, the plurality of data ports 202(1)-202(N) may be a sink of the plurality of SoundWire payload streams 210(1)-210(N).

With continuing reference to FIG. 2, the plurality of data ports 202(1)-202(N) is controlled by a plurality of respective register sets 212(1)-212(N). In a non-limiting example, according to the SoundWire specification, each of the plurality of register sets 212(1)-212(N) occupies a respective sixty-four bytes (64-byte) of an address space that begins at a hexadecimal address 0x0000 and ends at a hexadecimal address 0x003F. The plurality of register sets 212(1)-212(N) is divided into a plurality of respective data port (DP) registers 214(1)-214(N) (sometimes referred to as Non-Banked Registers), a plurality of respective first register banks 216(1)-216(N), and a plurality of respective second register banks 218(1)-218(N). For the convenience of reference and illustration, data port 202(Y) is discussed herein as a non-limiting example.

With continuing reference to FIG. 2, register set 212(Y) controls payload transports to the data port 202(Y). Specifically, DP register 214(Y) contains static configurations of the data port 202(Y) that is typically unchanged while the data port 202(Y) is receiving SoundWire payload stream 210(Y). In contrast, dynamic configurations of the data port 202(Y), which may be changed while receiving the SoundWire payload stream 210(Y), are duplicated in first register bank 216(Y) and second register bank 218(Y) to facilitate seamless operational changes in the data port 202(Y). In this regard, at any given time, one register bank (e.g., the first register bank 216(Y)), is selected by a control system 220 to function as an active register bank to control operations (present operation) of the data port 202(Y) while the other register bank (e.g., the second register bank 218(Y)), serves as a passive register bank and stays offline. When the master device 102 of FIG. 1 needs to reconfigure the data port 202(Y) for a future operation that is different from the present operation of the data port 202(Y), the control system 220 duplicates the dynamic configurations of the data port 202(Y) from the active register bank (the first register bank 216(Y)) to the passive register bank (the second register bank 218(Y)) and then makes necessary updates in the passive register bank. This is an effective approach to update the dynamic configurations of the data port 202(Y), especially when the data port 202(Y) continues receiving the SoundWire payload stream 210(Y). Once the updates in the passive register bank are completed, the control system 220 inverts the passive register bank and the active register bank to bring the passive register bank, which contains the updated dynamic configurations of the data port 202(Y), online to control the future operation of the data port 202(Y). As a result, the second register bank 218(Y) becomes the active register bank and the first register bank 216(Y) becomes the passive register bank and stays offline.

With continuing reference to FIG. 2, the first register bank 216(Y) and the second register bank 218(Y) of the data port 202(Y) comprise a plurality of first registers 222(1)-222(Q) and a plurality of second registers 224(1)-224(Q), respectively. In this regard, when the control system 220 duplicates the dynamic configurations of the data port 202(Y) from the active register bank to the passive register bank, the plurality of first registers 222(1)-222(Q) is copied to the plurality of second registers 224(1)-224(Q) in a sequential order. As illustrated next in FIG. 3, copying the plurality of first registers 222(1)-222(Q) in the sequential order may prevent the data port 202(Y) from being updated in a timely manner.

In this regard, FIG. 3 is a plot of an exemplary timeline 300 associated with switching the data port 202(Y) of FIG. 2 from the present operation to the future operation according to the SoundWire specification version 1.0. Elements of FIG. 2 are referenced in connection with FIG. 3 and will not be re-described herein.

With reference to FIG. 3, according to the SoundWire specification version 1.0, it takes one duration of a SoundWire frame (e.g., a SoundWire Write frame) to copy one register from the active register bank to the passive register bank. In this regard, as illustrated in the timeline 300, a first register 222(1) is copied to a second register 224(1) during a first SoundWire frame $F_1$, the first register 222(2) is copied to the second register 224(2) during a second SoundWire frame $F_2$, and so on. In this regard, copying the plurality of first registers 222(1)-222(Q) to the plurality of respective second registers 224(1)-224(Q) will take a plurality of SoundWire frames $F_1$-$F_Q$. If each of the plurality of SoundWire frames $F_1$-$F_Q$ has a frame duration $D_F$, the total amount of time required for copying the plurality of first registers 222(1)-222(Q) equals Q times $D_F$ (Q×$D_F$). According to the previous discussion in FIG. 2, the second register bank 218(Y) is switched from being the passive register bank to be the active register bank during a SoundWire frame $F_{Q+1}$.

Subsequently, the data port 202(Y) is switched to the future operation in a SoundWire frame $F_{Q+2}$. In this regard, it takes the duration of Q+1 SoundWire frames to reconfigure and switch the data port 202(Y) to the future operation. If the master device 102 of FIG. 1 needs to reconfigure multiple data ports among the plurality of data ports 202(1)-202(N) in the slave device 104(X), the total amount of reconfiguration and switching time will multiply. The longer reconfiguration and switching delay may prevent the data port 202(Y) from being updated in a timely manner. As a result, performance of the data port 202(Y) may suffer and bandwidth overhead associated with reconfiguring and switching the data port 202(Y) may increase. Hence, it may be desirable to be able to reconfigure and switch the data port 202(Y) with less delay and reduced bandwidth overhead than following the sequential reconfiguration and switching approach defined by the SoundWire specification version 1.0.

Figure 4:
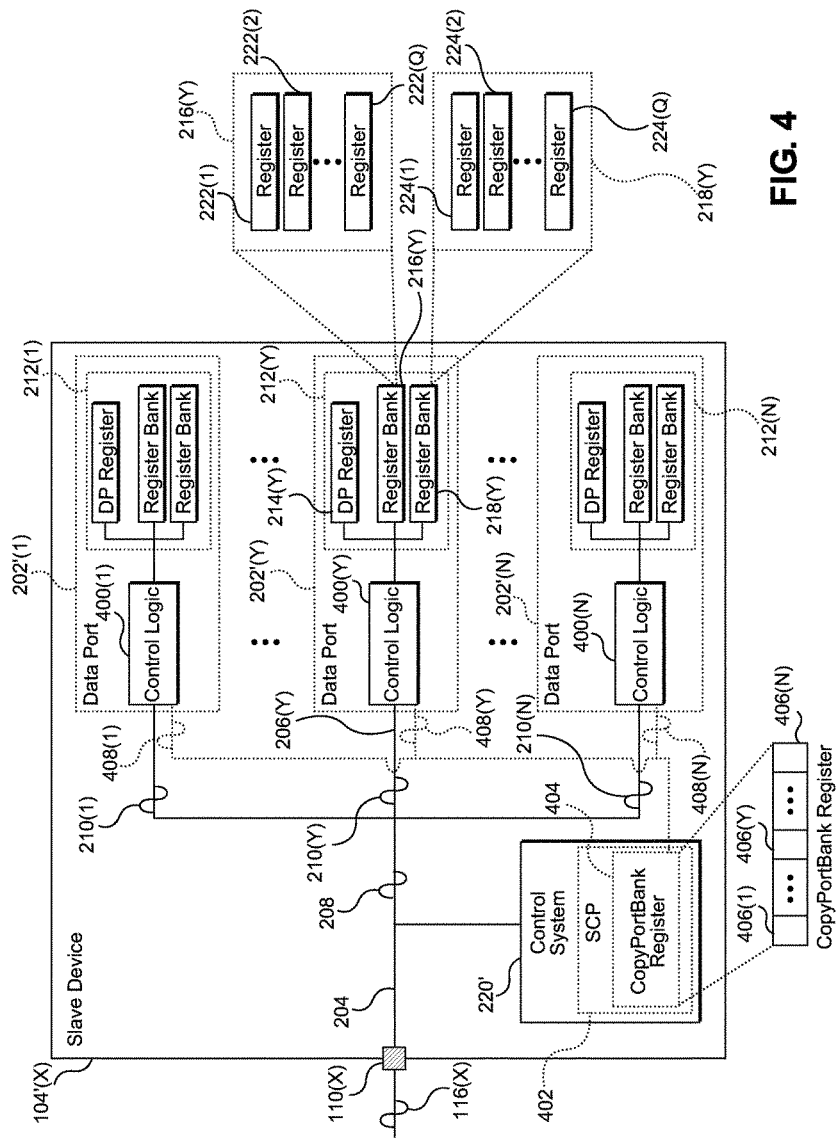
FIG. 4 is a schematic diagram of an exemplary SoundWire slave device that supports time-constrained register bank copying when the SoundWire slave device is reconfigured and switched from the present operation to the future operation.

In this regard, FIG. 4 is a schematic diagram of an exemplary SoundWire slave device 104'(X) that supports time-constrained register bank copying when the slave device 104'(X) is reconfigured and switched from the present operation to the future operation. Common elements between FIGS. 2 and 4 are shown therein with common element numbers and will not be re-described herein. The slave device 104'(X) comprises a plurality of data ports 202'(1)-202'(N). The plurality of data ports 202'(1)-202'(N) comprises the plurality of respective register sets 212(1)-212(N) and a plurality of respective control logics 400(1)-400(N). Data port 202'(Y) is discussed hereinafter as a non-limiting example. Exemplary aspects discussed with reference to the data port 202'(Y) are applicable to the plurality of data ports 202'(1)-202'(N) as well.

With reference to FIG. 4, control logic 400(Y) is coupled to the first register bank 216(Y) and the second register bank 218(Y) in the data port 202'(Y). In a non-limiting example, the control logic 400(Y) may be a hardware-based control logic. When the data port 202'(Y) is switched from the present operation, controlled by, for example, the first register bank 216(Y), to the future operation, controlled by, for example, the second register bank 218(Y), the plurality of first registers 222(1)-222(Q) in the first register bank 216(Y) is substantially concurrently copied to the plurality of second registers 224(1)-224(Q) in the second register bank 218(Y). By copying the plurality of first registers 222(1)-222(Q) substantially concurrently, as opposed to copying sequentially according to the SoundWire specification, it is possible to copy the plurality of first registers 222(1)-222(Q) within a temporal limit. In a non-limiting example, the temporal limit may be as short as the duration of one SoundWire frame. Hence, the data port 202'(Y) can be reconfigured and switched to the future operation with reduced delay and bandwidth overhead. Furthermore, by copying the plurality of first registers 222(1)-222(Q) substantially concurrently, as opposed to requiring copying absolutely concurrently, it is possible to copy the plurality of first registers 222(1)-222(Q) within the temporal limit even though the plurality of first registers 222(1)-222(Q) are not copied at exactly the same time. That is, minor variations are still "substantially concurrently" as that term is used herein.

With continuing reference to FIG. 4, the slave device 104'(X) also comprises a control system 220' that controls the plurality of data ports 202'(1)-202'(N) based on a slave control port (SCP) register 402. In a non-limiting example, the SCP register 402 occupies one hundred and ninety-two bytes (192-byte) of an address space that begins at hexadecimal address 0x0040 and ends at hexadecimal address 0x00FF. A CopyPortBank register 404 is defined inside the address space occupied by the SCP register 402 to control the plurality of control logics 400(1)-400(N). The CopyPortBank register 404 comprises a plurality of port bits 406(1)-406(N) configured to control the plurality of respective control logics 400(1)-400(N). In a non-limiting example, the CopyPortBank register 404 may be configured to provide a plurality of respective bank selection signals 408(1)-408(N) to the plurality of control logics 400(1)-400(N). In another non-limiting example, a port bit among the plurality of port bits 406(1)-406(N) is set to one (1) to select a respective data port among the plurality of data ports 202'(1)-202'(N) to perform a bank-copying operation. In this regard, one or more data ports among the plurality of data ports 202'(1)-202'(N) may be selected by the CopyPortBank register 404 to perform one or more respective bank-copying operations simultaneously.

Figure 5:
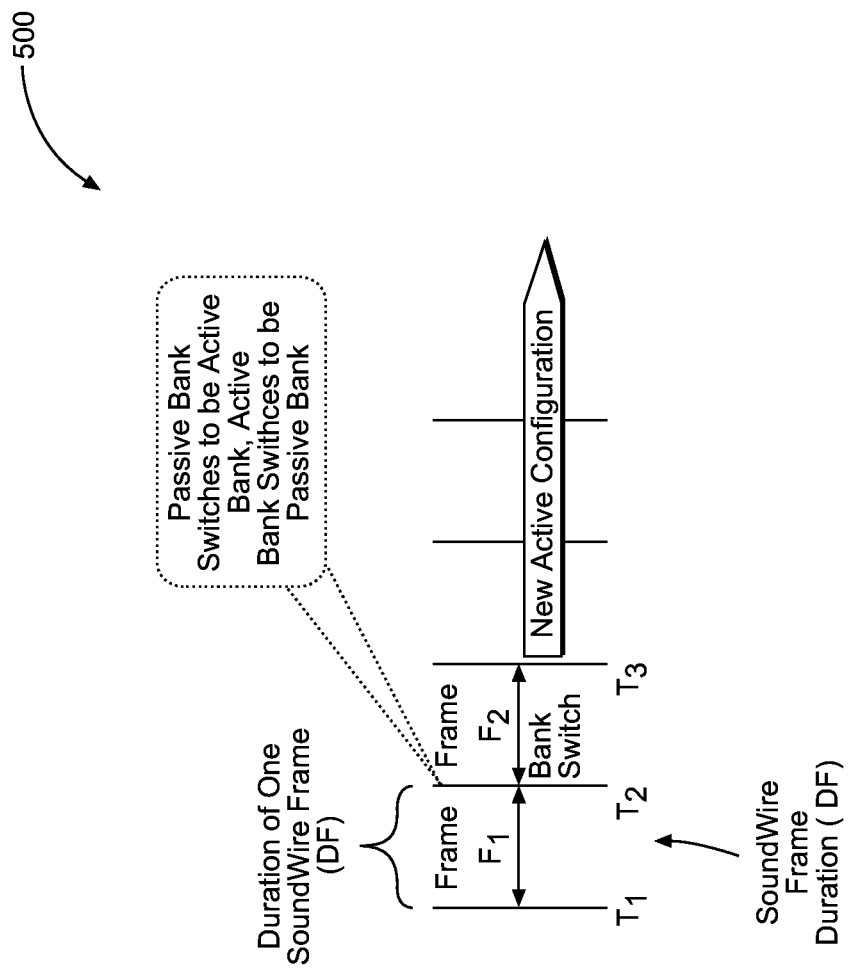
FIG. 5 is a plot of an exemplary timeline associated with time-constrained switching of the data port in the SoundWire slave device of FIG. 4 from the present operation to the future operation.

FIG. 5 is a plot of an exemplary timeline 500 associated with time-constrained switching of the data port 202'(Y) from the present operation to the future operation. Elements of FIG. 4 are referenced in connection with FIG. 5 and will not be re-described herein.

With reference to FIG. 5, because the plurality of first registers 222(1)-222(Q) are copied to the plurality of second registers 224(1)-224(Q) substantially concurrently, it takes only the duration of one SoundWire frame $D_F$ to copy the plurality of first registers 222(1)-222(Q). As such, the second register bank 218(Y) is switched from being the passive register bank to be the active register bank during a SoundWire frame $F_2$. Hence, the data port 202'(Y) is reconfigured and switched from the present operation to the future operation with less delay and reduced bandwidth overhead.

Figure 6:
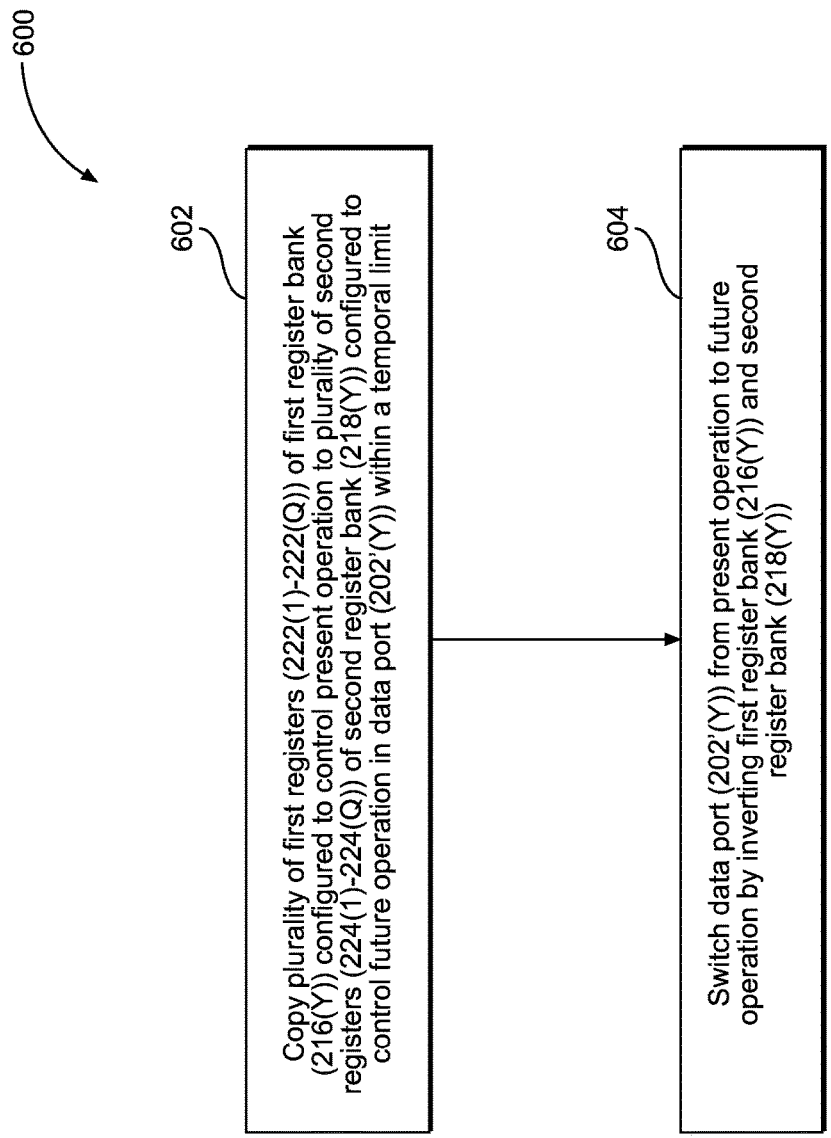
FIG. 6 is a flowchart of an exemplary operation switching process employed by the SoundWire slave device of FIG. 4 for switching the data port from the present operation to the future operation within a temporal limit.

FIG. 6 is a flowchart of an exemplary operation switching process 600 employed by the slave device 104'(X) of FIG. 4 for switching the data port 202'(Y) from the present operation to the future operation within the temporal limit. Elements of FIG. 4 are referenced in connection with FIG. 6 and will not be re-described herein.

With reference to FIG. 6, to switch the data port 202'(Y) from the present operation to the future operation, the plurality of first registers 222(1)-222(Q) of the first register bank 216(Y), which is configured to control the present operation, is copied to the plurality of second registers 224(1)-224(Q) of the second register bank 218(Y), which is configured to control the future operation within a temporal limit (block 602). In a non-limiting example, the temporal limit may be as short as the duration of one SoundWire frame. Subsequently, the data port 202'(Y) is switched from the present operation to the future operation by inverting the first register bank 216(Y) and the second register bank 218(Y) (block 604). As such, the second register bank 218(Y) becomes the active register bank to control the future operation of the data port 202'(Y).

As discussed above, the inversion of the first register bank 216(Y) and the second register bank 218(Y) is performed by the control logic 400(Y). To further illustrate the mechanism employed by the data port 202'(Y) to control the switching between the first register bank 216(Y) and the second register bank 218(Y), FIG. 7 is provided and discussed next.

Figure 7:
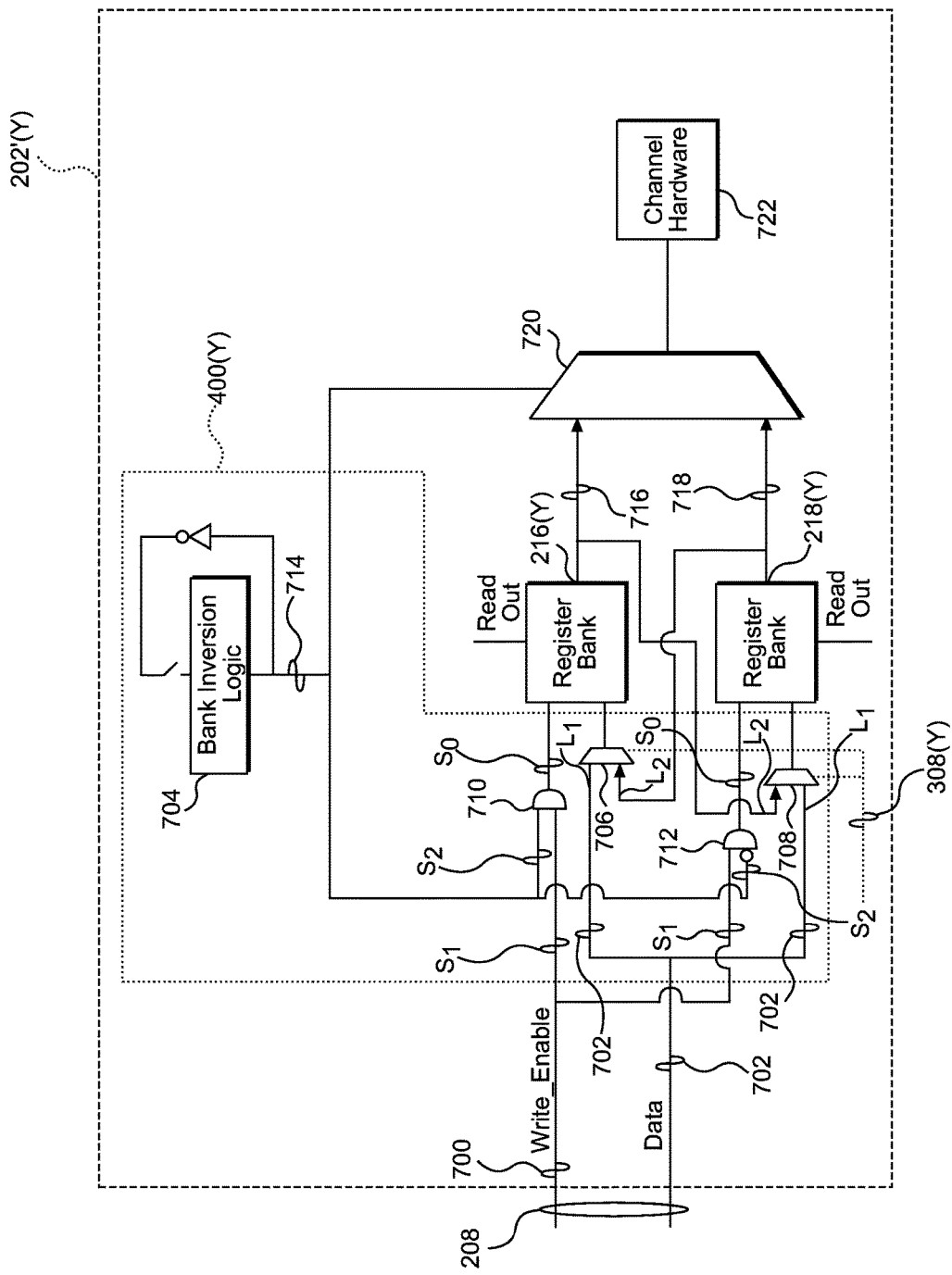
FIG. 7 is an exemplary schematic diagram of the data port of FIG. 4 configured to switch a first register bank and a second register bank based on a control signal and a bank selection signal.

In this regard, FIG. 7 is a schematic diagram of the data port 202'(Y) of FIG. 4 configured to switch the first register bank 216(Y) and the second register bank 218(Y) based on the control signal 208 and bank selection signal 408(Y). Common elements between FIGS. 4 and 7 are shown therein with common element numbers and will not be re-described herein.

With reference to FIG. 7, the control signal 208 comprises a write_enable signal 700 and a data signal 702. The write_enable signal 700 selects one of the first register bank 216(Y) and the second register bank 218(Y) for a write operation. For example, if the write_enable signal 700 selects the first register bank 216(Y), the first register bank 216(Y) is thus enabled for the write operation. The control logic 400(Y) comprises a bank inversion logic 704, a first multiplexer 706, a second multiplexer 708, a first AND gate 710, and a second AND gate 712.

With continuing reference to FIG. 7, each of the first AND gate 710 and the second AND gate 712 is configured to receive a first input signal $S_1$ and a second input signal $S_2$, respectively. The first input signal $S_1$ and the second input signal $S_2$ may be configured to represent either a logical one (1) or a logical zero (0). Accordingly, each of the first AND gate 710 and the second AND gate 712 will generate a respective output $S_O$ as logical 1 only if the respective first input signal $S_1$ and the respective second input signal $S_2$ are both provided as logical 1s. Otherwise, the respective output $S_O$ will be logical 0.

With continuing reference to FIG. 7, the write_enable signal 700, which is asserted to represent logical 1, is provided to the first AND gate 710 and the second AND gate 712 as the respective first input signal $S_1$. The first AND gate 710 and the second AND gate 712 further receive a bank_select signal 714 from the bank inversion logic 704 as the respective second input signal $S_2$. As illustrated in FIG. 7, the respective second input signal $S_2$ of the second AND gate 712 is inverted from the respective second input signal $S_2$ of the first AND gate 710. In this regard, only one of the first AND gate 710 and the second AND gate 712 is able to generate the respective output $S_O$ as logical 1. In other words, the respective outputs $S_O$ of the first AND gate 710 and the second AND gate 712 are mutually exclusive, thus allowing only one of the first register bank 216(Y) and the second register bank 218(Y) to be enabled for the write operation. In a non-limiting example, the bank inversion logic 704 may be configured to enable the first register bank 216(Y) or the second register bank 218(Y) for the write operation by providing the bank_select signal 714 as logical 1 or logical 0. In this regard, when the bank_select signal 714 is asserted as logical 1, the respective output $S_O$ of the first AND gate 710 is logical 1. On the other hand, since the bank_select signal 714 is provided to the second AND gate 712 as the inverted second input signal $S_2$, the output signal $S_O$ of the second AND gate 712 is logical 0. As a result, the first register bank 216(Y) is enabled for the write operation. Likewise, if the bank_select signal 714 is provided as logical 0, the output signal $S_O$ of the second AND gate 712 will be logical 1 and the output signal $S_O$ of the first AND gate 710 will be logical 0. Therefore, the second register bank 218(Y) is enabled for the write operation.

With continuing reference to FIG. 7, the first multiplexer 706 and the second multiplexer 708 both receive the data signal 702 on a respective first input line $L_1$. A first output 716 from the first register bank 216(Y) is looped back to a respective second input line $L_2$ of the second multiplexer 708. A second output 718 from the second register bank 218(Y) is looped back to a respective second input line $L_2$ of the second multiplexer 708. The first multiplexer 706 and the second multiplexer 708 are both controlled by the bank selection signal 408(Y) that is provided by the CopyPortBank register 404 (not shown) of FIG. 4. In this regard, when the bank selection signal 408(Y) is asserted to select the data port 202'(Y), the first register bank 216(Y) is copied to the second register bank 218(Y) if the second register bank 218(Y) is enabled for the write operation. Likewise, the second register bank 218(Y) is copied to the first register bank 216(Y) if the first register bank 216(Y) is enabled for the write operation.

With continuing reference to FIG. 7, the first output 716 of the first register bank 216(Y) and the second output 718 of the second register bank 218(Y) are provided to a selection multiplexer 720. The selection multiplexer 720 is also controlled by the bank_select signal 714. Hence, when the bank_select signal 714 enables the first register bank 216(Y) for the write operation, the first register bank 216(Y) becomes the active register bank and the first output 716, which comprises the data signal 702, is provided to a channel hardware 722. In this regard, the data port 202'(Y) is controlled by the first register bank 216(Y). In contrast, when the bank_select signal 714 enables the second register bank 218(Y) for the write operation, the second register bank 218(Y) becomes the active register bank and the second output 718, which comprises the data signal 702, is provided to the channel hardware 722. In this regard, the data port 202'(Y) is controlled by the second register bank 218(Y).

The time-constrained data copying between the first register bank 216(Y) and the second register bank 218(Y) as discussed above in reference to FIGS. 4-7 may also be provided in a generalized data interface that is not configured according to the SoundWire specification. In this regard, FIG. 8 is a schematic diagram of an exemplary data interface 800 configured to support time-constrained data copying between two data storage media selected from a plurality of data storage media 802(1)-802(P).

Figure 8:
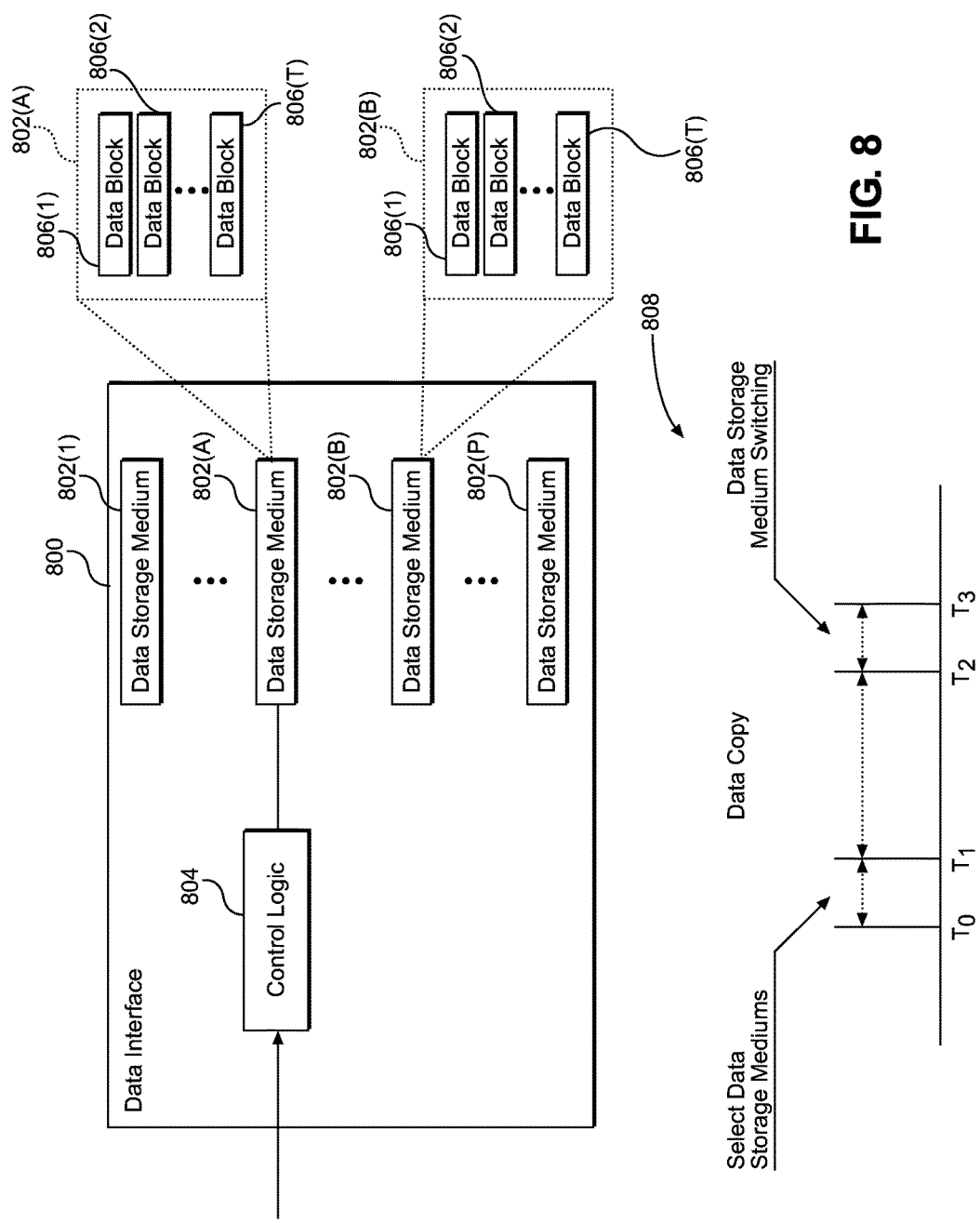
FIG. 8 is a schematic diagram of an exemplary data interface configured to support time-constrained data copying between two data storage media selected from a plurality of data storage media.

With reference to FIG. 8, the data interface 800 comprises a control logic 804 configured to perform the time-constrained data copying between a first data storage medium 802(A) and a second data storage medium 802(B) that are selected from the plurality of data storage media 802(1)-802(P). In a non-limiting example, the control logic 804 may be supported by hardware, software, or a combination of both. In another non-limiting example, the plurality of data storage media 802(1)-802(P) may include universal flash storage (UFS), universal serial bus (USB) storage, random access memory (RAM), read-only memory (ROM), and hard-drive.

With continuing reference to FIG. 8, in a non-limiting example, the first data storage medium 802(A) functions as an active data storage medium and the second data storage medium 802(B) functions as a passive data storage medium. In this regard, the first data storage medium 802(A) is online and controls a present operation of the data interface 800. The second data storage medium 802(B), on the other hand, is offline and can be configured to control a future operation of the data interface 800.

The first data storage medium 802(A) and the second data storage medium 802(B) each comprise a plurality of respective data blocks 806(1)-806(T). The control logic 804 is configured to copy concurrently the plurality of respective data blocks 806(1)-806(T) of the first data storage medium 802(A) to the plurality of respective data blocks 806(1)-806(T) of the second data storage medium 802(B) within a predetermined temporal limit. In a non-limiting example, the predetermined temporal limit can be based on a time period required to transfer a data frame in the data interface 800. The control logic 804 is further configured to switch the data interface 800 to the future operation by inverting the first data storage medium 802(A) and the second data storage medium 802(B). In this regard, the second data storage medium 802(B) becomes the active data storage medium and is online while the first data storage medium 802(A) becomes the passive data storage medium and stays offline.

With continuing reference to FIG. 8, the time-constrained data copying operation performed by the control logic 804 can be further illustrated by a timeline graph 808. At time $T_0$, the control logic 804 selects the first data storage medium 802(A) and the second data storage medium 802(B) among the plurality of data storage media 802(1)-802(P). At time $T_1$, the control logic 804 begins copying the plurality of respective data blocks 806(1)-806(T) of the first data storage medium 802(A) to the plurality of respective data blocks 806(1)-806(T) of the second data storage medium 802(B). The control logic 804 completes the data copying at time $T_2$. In this regard, the duration between the time $T_1$ and the time $T_2$ corresponds to the predetermined temporal limit. At the time $T_2$, the control logic 804 switches the data interface 800 to the future operation by inverting the first data storage medium 802(A) and the second data storage medium 802(B). Subsequently at time $T_3$, the data interface begins the future operation under the control of the second data storage medium 802(B).

The time-constrained data copying between storage media according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 9:
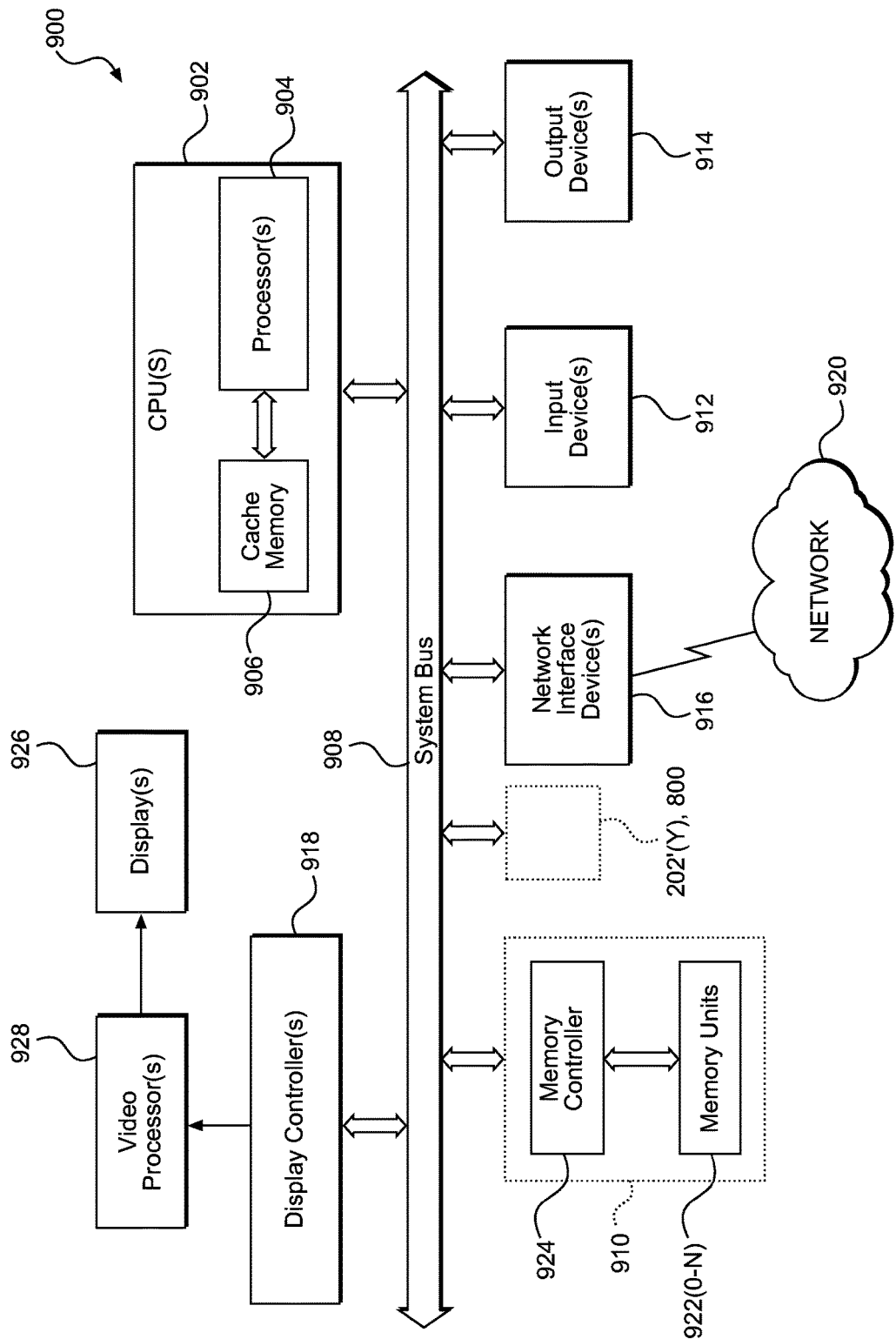
FIG. 9 is a block diagram of an exemplary processor-based system that can employ the data port of FIG. 7 and the data interface of FIG. 8.

In this regard, FIG. 9 illustrates an example of a processor-based system 900 that can employ the data port 202'(Y) of FIG. 7 and the data interface 800 of FIG. 8. In this example, the processor-based system 900 includes one or more central processing units (CPUs) 902, each including one or more processors 904. The CPU(s) 902 may have cache memory 906 coupled to the processor(s) 904 for rapid access to temporarily stored data. The CPU(s) 902 is coupled to a system bus 908. As is well known, the CPU(s) 902 communicates with these other devices by exchanging address, control, and data information over the system bus 908. Although not illustrated in FIG. 9, multiple system buses 908 could be provided, wherein each system bus 908 constitutes a different fabric.

Other master and slave devices can be connected to the system bus 908. As illustrated in FIG. 9, these devices can include a memory system 910, one or more input devices 912, one or more output devices 914, one or more network interface devices 916, and one or more display controllers 918, as examples. The data port 202'(Y) of FIG. 7 and the data interface 800 of FIG. 8 can also be connected to the system bus 908. The input device(s) 912 can include any type of input device, including, but not limited to, input keys, switches, voice processors, etc. The output device(s) 914 can include any type of output device, including, but not limited to, audio, video, other visual indicators, etc. The network interface device(s) 916 can be any device configured to allow exchange of data to and from a network 920. The network 920 can be any type of network, including, but not limited to, a wired or wireless network, a private or public network, a local area network (LAN), a wireless local area network (WLAN), a wide area network (WAN), a BLUETOOTH™ network, or the Internet. The network interface device(s) 916 can be configured to support any type of communications protocol desired. The memory system 910 can include one or more memory units 922(0-N) and a memory controller 924.

The CPU(s) 902 may also be configured to access the display controller(s) 918 over the system bus 908 to control information sent to one or more displays 926. The display controller(s) 918 sends information to the display(s) 926 to be displayed via one or more video processors 928, which process the information to be displayed into a format suitable for the display(s) 926. The display(s) 926 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A data port, comprising:
    a first register bank comprising a plurality of first registers, the first register bank configured to function as an active register bank to control a present operation of a data port;
    a second register bank comprising a plurality of second registers, the second register bank configured to function as a passive register bank to control a future operation of the data port; and
    a control logic coupled to the first register bank and the second register bank, the control logic configured to copy concurrently the plurality of first registers of the first register bank to the plurality of second registers of the second register bank within a temporal limit and without interrupting the present operation of the data port;
    wherein the control logic comprises:
        a bank inversion logic configured to invert the active register bank and the passive register bank to switch the data port from the present operation to the future operation;
        a first multiplexer coupled to the first register bank; and
        a second multiplexer coupled to the second register bank, wherein:
            if the second register bank is enabled for a write operation and the first multiplexer is enabled for a bank-copying operation, the plurality of first registers of the first register bank is copied to the plurality of second registers of the second register bank; and
            if the first register bank is enabled for the write operation and the second multiplexer is enabled for the bank-copying operation, the plurality of second registers of the second register bank is copied to the plurality of first registers of the first register bank.

2. The data port of claim 1 integrated into a MIPI® Alliance SoundWire$^{SM}$ (SoundWire) slave device.

3. The data port of claim 2, wherein the temporal limit for copying the plurality of first registers of the first register bank to the plurality of second registers of the second register bank is defined by a SoundWire frame duration.

4. The data port of claim 1 wherein the future operation of the data port occurs after the plurality of first registers of the first register bank is copied to the plurality of second registers of the second register bank.

5. The data port of claim 1, wherein the control logic is a hardware-based control logic.

6. The data port of claim 1 integrated into an integrated circuit (IC).

7. The data port of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

8. A method for switching a data port from a present operation to a future operation, comprising:
   copying concurrently a plurality of first registers of a first register bank configured to function as an active register bank to control a present operation to a plurality of second registers of a second register bank configured to function as a passive register bank to control a future operation in a data port within a temporal limit;
   copying the plurality of first registers of the first register bank to the plurality of second registers of the second register bank if the second register bank is enabled for a write operation and a first multiplexer coupled to the first register bank is enabled for a bank-copying operation;
   copying the plurality of second registers of the second register bank to the plurality of first registers of the first register bank if the first register bank is enabled for the write operation and a second multiplexer coupled to the second register bank is enabled for the bank-copying operation; and
   switching the data port from the present operation to the future operation by inverting the first register bank and the second register bank after copying the plurality of first registers of the first register bank to the plurality of second registers of the second register bank.

9. The method of claim 8, further comprising copying the plurality of first registers of the first register bank to the plurality of second registers of the second register bank without interrupting the present operation of the data port.

10. An electronic device, comprising:
   a plurality of data ports, each of the plurality of data ports comprising:
      a respective first register bank comprising a plurality of first registers, the respective first register bank configured to function as a respective active register bank to control a present operation of a data port;
      a respective second register bank comprising a plurality of second registers, the respective second register bank configured to function as a respective passive register bank to control a future operation of the data port; and
      a respective control logic coupled to the respective first register bank and the respective second register bank, the respective control logic configured to copy concurrently the plurality of first registers of the respective first register bank to the plurality of second registers of the respective second register bank within a temporal limit and without interrupting the present operation of the data port, wherein the respective control logic comprises:
         a bank inversion logic configured to invert the respective active register bank and the respective passive register bank to switch the data port from the present operation to the future operation;
         a first multiplexer coupled to the respective first register bank; and
         a second multiplexer coupled to the respective second register bank, wherein:
            if the respective second register bank is enabled for a write operation and the first multiplexer is selected for a bank-copying operation, the plurality of first registers of the respective first register bank is copied to the plurality of second registers of the respective second register bank; and
            if the respective first register bank is enabled for the write operation and the second multiplexer is enabled for the bank-copying operation, the plurality of second registers of the respective second register bank is copied to the plurality of first registers of the respective first register bank; and
   a control system configured to control the plurality of data ports based on at least one control register.

11. The electronic device of claim 10, wherein:
   each of the plurality of data ports is a MIPI® Alliance SoundWire$^{SM}$ (SoundWire) data port and comprises a respective data port (DP) register for storing a basic configuration of the data port;
   the temporal limit for copying the plurality of first registers of the respective first register bank to the plurality of second registers of the respective second register bank is defined by a SoundWire frame duration; and
   the at least one control register is a SoundWire slave control port (SCP) register.

12. The electronic device of claim 10, wherein the at least one control register comprises a CopyPortBank register configured to select one or more data ports among the plurality of data ports to perform one or more respective bank-copying operations.

13. The electronic device of claim 12, wherein:
   the CopyPortBank register comprises a plurality of respective port bits corresponding to the plurality of data ports; and
   the one or more data ports among the plurality of data ports are selected to perform the one or more respective bank-copying operations by setting one or more respective port bits in the CopyPortBank register to one (1).

14. A data interface, comprising:
   a plurality of data storage media, each of the plurality of data storage media comprising a plurality of respective data blocks; and a control logic configured to:
  select a first data storage medium and a second data storage medium among the plurality of data storage media, wherein:
    the first data storage medium is an active data storage medium for controlling a present operation of a data interface; and
    the second data storage medium is a passive data storage medium for controlling a future operation of the data interface;
  copy concurrently the plurality of respective data blocks of the first data storage medium to the plurality of respective data blocks of the second data storage medium within a predetermined temporal limit; and
  switch the data interface to the future operation by inverting the first data storage medium and the second data storage medium;

wherein the control logic comprises:
  a first multiplexer coupled to the first storage medium; and
  a second multiplexer coupled to the second storage medium, wherein:
    if the second storage medium is enabled for a write operation and the first multiplexer is enabled for a bank-copying operation, the plurality of respective data blocks of the first storage medium is copied to the plurality of respective data blocks of the second storage medium; and
    if the first storage medium is enabled for the write operation and the second multiplexer is enabled for the bank-copying operation, the plurality of respective data blocks of the second storage medium is copied to the plurality of respective data blocks of the first storage medium.

* * * * *